United States Patent [19]

Pier

[11] Patent Number: 4,750,362
[45] Date of Patent: Jun. 14, 1988

[54] ACCELEROMETER PACKAGE

[75] Inventor: Nicholas F. Pier, Thousand Oaks, Calif.

[73] Assignee: Litton Systems Inc., Beverly Hills, Calif.

[21] Appl. No.: 510,786

[22] Filed: Jul. 5, 1983

[51] Int. Cl.⁴ ............................................. G01P 15/08
[52] U.S. Cl. ...................................................... 73/497
[58] Field of Search ............................................ 73/497

[56] References Cited

U.S. PATENT DOCUMENTS

| | | | |
|---|---|---|---|
| 2,855,495 | 10/1958 | Grant | 73/497 |
| 3,112,651 | 12/1963 | Zingery | 73/497 X |
| 3,557,628 | 1/1971 | Tsukada | 73/497 |
| 4,212,443 | 7/1980 | Duncan et al. | 73/504 |

Primary Examiner—Stewart J. Levy
Attorney, Agent, or Firm—Roy L. Brown; Elliott N. Kramsk

[57] ABSTRACT

A plurality of accelerometers enclosed within a housing and mounted upon a thermally conductive support member, a temperature sensor and an optional temperature controlling element within the housing. Each of the accelerometers having two precision surfaces thereon, angular positioned by a predetermined angle, typically ninety degrees, between such surfaces.

7 Claims, 2 Drawing Sheets

ACCELEROMETER PACKAGE

BACKGROUND OF THE INVENTION

A plurality of accelerometers, typically two or three accelerometers, are frequently used together. For example, in inertial navigation systems two or three gyroscopes may be used in a system with two or three accelerometers to produce a reading of angular velocity, angular acceleration, angular position or a combination of those factors.

In certain stabilized systems, the sensing axes of two accelerometers may be maintained locally horizontal, and the sensing axes oriented in two directions. Typically those two directions are at right angles such as east-west and north-south. A third accelerometer may, alternatively, be positioned with its sensing axis up and down. Such an accelerometer would measure the acceleration of gravity.

When the accelerometers are not maintained with their sensing axes locally horizontal, as when they are attached to a vehicle, such a system may be characterized as a "strapped-down" system.

For purposes of this invention it is not important whether the system is a locally level system or a strapped down system. Further, the number of accelerometers is not important. Typically clusters of accelerometers contain two or three accelerometers. They may, however, contain more accelerometers as required by the user.

In precision systems, the accelerometers need to be kept at the same temperature so that the scale factor and bias remains constant. To that end, it is customary to place a temperature controller on each accelerometer. The temperature controller, typically, contains a temperature sensor, a heating or cooling element, and a servo circuit for controlling the heating or cooling element in response to a predetermined signal and the measured temperature. Thus, in a three-accelerometer system it was necessary to have three temperature controllers.

In either kind of system, it is necessary precisely to position the sensing axes of the accelerometers. To that end, an accurately positioned precision surface supports the accelerometers. On the outer case of each accelerometer is one precision mating surface which is placed in contact with the precision supporting surface. Accelerometers which are designed to measure acceleration parallel to the precision supporting surface have a precision mating surface parallel to the sensing axis of the accelerometer on the outside of the accelerometer case or housing. For example, with a horizontal supporting plate, such accelerometers could be used to measure north-south, east-west accelerations. Accelerometers which are designed to measure acceleration perpendicular to the precision supporting surface have a precision mating surface perpendicular to the sensing axis of the accelerometer on the outside of the accelerometer case or housing. For example, with a horizontal supporting surface, such accelerometers could be used to measure the vertical acceleration of gravity.

It is therefore an object of the invention to package accelerometers in an optimum manner to ensure uniform temperature among the accelerometers.

It is also an object of this invention to package an accelerometer with two precision surfaces thereon for maximum utility of the accelerometers.

BRIEF DESCRIPTION OF THE DRAWINGS

Other objects will become apparent from the following description, taken together with the accompanying drawings, in which.

DETAILED DESCRIPTION OF THE INVENTION

Figure 1:
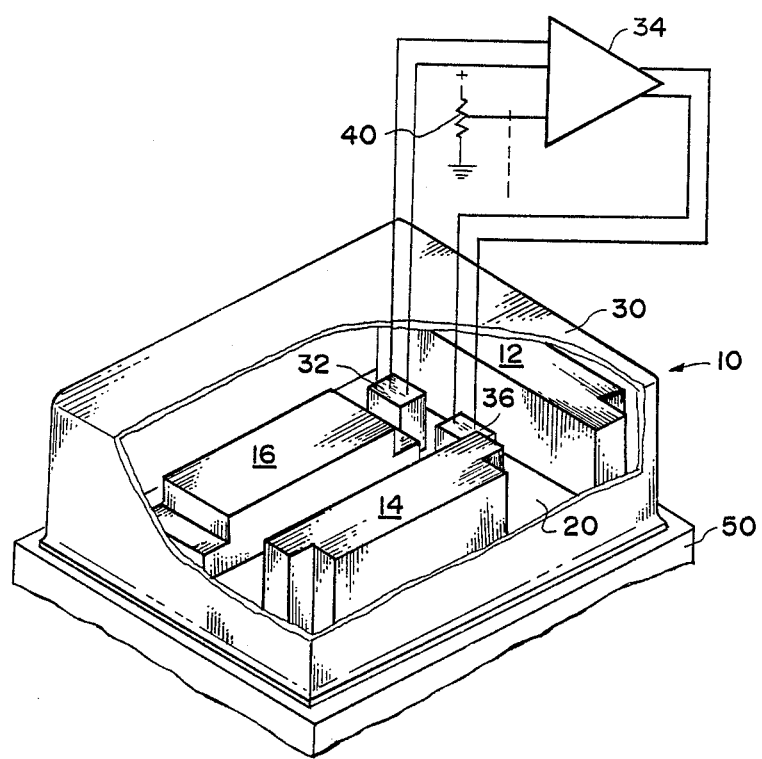
FIG. 1 is an oblique drawing of three accelerometers in a package according to this invention, with a part of the enclosure broken away.
Figure 2:
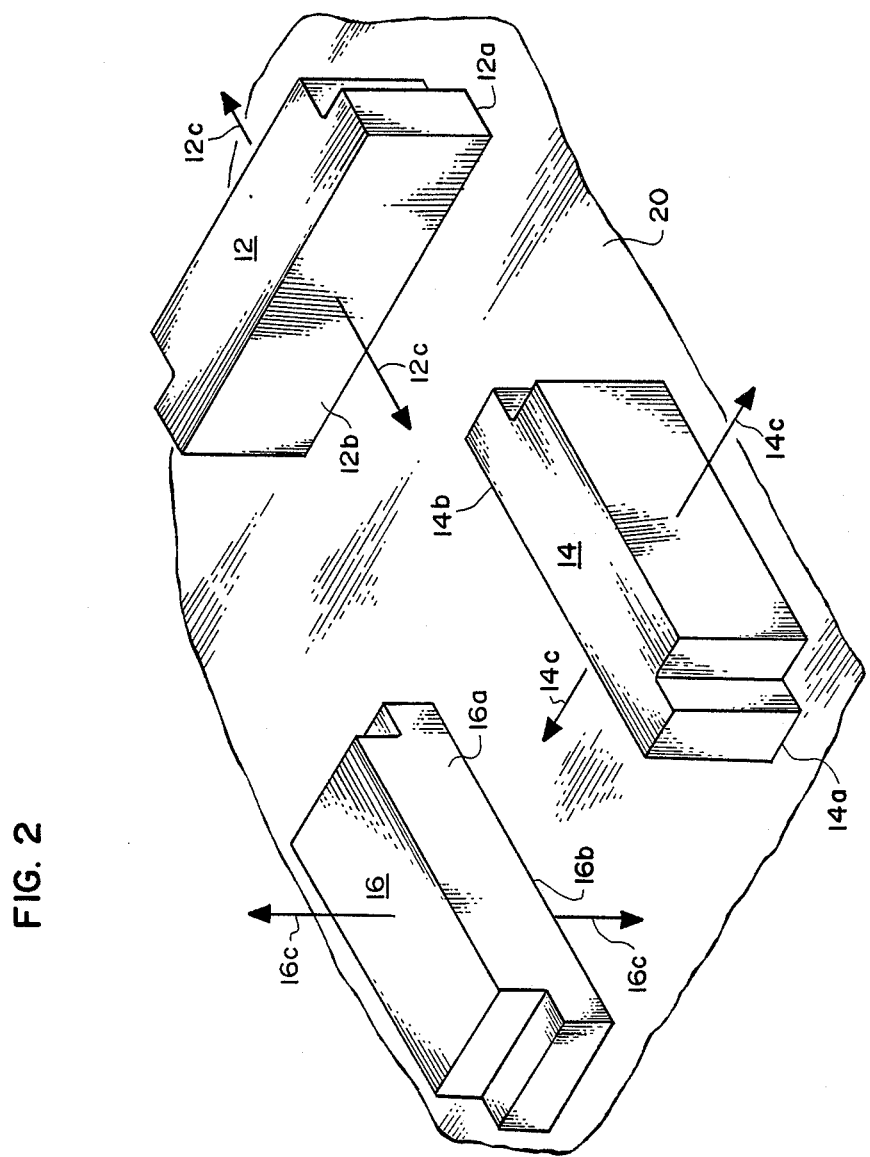
FIG. 2 is an expanded view of only the accelerometers mounted upon a precision conductive surface.

The accelerometer cluster 10 of this invention is shown in FIG. 1. As shown more particularly in FIG. 2, three accelerometers 12, 14, 16 each have two precision surfaces 12a, 12b, 14a, 14b, 16a, 16b on the exterior case thereof. In each accelerometer, 12,14,16 the "a" and "b" surfaces are shown perpendicular to each other. The "a" surface is parallel to the sensing axis "c", and the "b" surface is perpendicular to the sensing axis "c" on each accelerometer 12,14,16. For example, surfaces 12a and 12b are perpendicualr to each other, surface 12a is parallel to sensing axis 12c, and surface 12b is perpendicular to sensing axis 12c. As shown in both Figures, surfaces 12a, 14a and 16b are in contact with a precision conductive surface 20.

To keep all of the accelerometers substantially at the same temperature so they have the same scale factor and bias, it is contemplated by this invention to enclose the accelerometers within a housing 30, to attach them to the conductive plate 20 for heat conduction, and to control the temperature within the housing. To control the temperature within the housing, a temperature sensor 32 which may, for example, be a thermocouple generates a signal which is a measure of the temperature within the housing 30. The sensor 32 signal is delivered to a servo amplifier 34 which, in turn, is connected to control the operation of a temperature controller 36. The temperature controller 36 may, for example, be a heating or cooling member. The temperature command signal is delivered to the amplifier 34. The command signal may be manually delivered through the shown potentiometer 40, or it may be delivered from some other electrical apparatus.

Alternatively, the temperature may merely be monitored, and the signal from amplifier 34 is then delivered to a computer (not shown) for compensation due to changing temperature. Note that only one measurement is required because the temperatures of the accelerometers are maintained by the plate 20 substantially equal.

The accelerometer housing 10 is shown sitting upon a base 50 which is representative of the support for the accelerometer package. For example, 50 may be a supporting vehicle.

Although the invention has been described in detail above, it is not intended that the invention shall be limited by that description, but only by that description together with the appended claims.

What is claimed is:

1. An accelerometer apparatus comprising:
   a thermally conductive supporting member having a reference surface;
   a plurality of accelerometers mounted on the reference surface for thermal conduction relative to the supporting member;
   a housing surrounding and thermally isolating said plurality of accelerometers; and a temperature sensor within said housing for sensing the temperature of the accelerometers.

2. The apparatus of claim 1 which further comprises;
a temperature controller within said housing; and
a servo system connected between said sensor and said controller to control the temperature within said housing of said accelerometers.

3. The apparatus of claim 1 in which:
each of said accelerometers has a sensing axis and two outer surfaces of preselected angular orientations relative to said sensing axis, one outer surface of each accelerometer engaging the reference surface to support and align the accelerometers and equalize the temperature between them.

4. The apparatus of claim 3 wherein:
said reference surface and said outer surfaces are subtantially flat.

5. The apparatus of claim 4 wherein:
the outer surfaces of the accelerometers are perpendicular to each other; and
one of the outer surfaces of each accelerometer is parallel to the sensing axis of the accelerometer and the other of the outer surfaces is perpendicular to the sensing axis.

6. A method of equalizing and monitoring the temperature of a plurality of accelerometers, comprising:
mounting the accelerometers to a reference surface of a thermally conductive support member for equalization of temperature between the accelerometers;
thermally isolating the accelerometers above the surface by surrounding them with a housing; and
sensing the equalized temperature of the accelerometers.

7. The method of claim 6 which further comprises:
compensating for the effects of temperature on the outputs of the accelerometers according to said equalized temperature.

* * * * *